United States Patent
Kruehler et al.

(10) Patent No.: US 11,686,629 B2
(45) Date of Patent: Jun. 27, 2023

(54) DEVICES AND METHOD FOR CALIBRATING MEASURED VALUES

(71) Applicant: WAGO Verwaltungsgesellschaft mbH, Minden (DE)

(72) Inventors: Matthias Kruehler, Bueckeburg (DE); Thorsten Lindner, Hannover (DE)

(73) Assignee: WAGO Verwaltungsgesellschaft mbH, Minden (DE)

( * ) Notice: Subject to any disclaimer, the term of this patent is extended or adjusted under 35 U.S.C. 154(b) by 89 days.

(21) Appl. No.: 17/332,585

(22) Filed: May 27, 2021

(65) Prior Publication Data
US 2021/0372863 A1      Dec. 2, 2021

(30) Foreign Application Priority Data

May 27, 2020   (DE) ................. 10 2020 114 244.7

(51) Int. Cl.
*H03M 1/10*     (2006.01)
*G01K 15/00*    (2006.01)
(Continued)

(52) U.S. Cl.
CPC ............. *G01K 15/002* (2013.01); *G01K 7/02* (2013.01); *G01K 7/16* (2013.01); *H03M 1/10* (2013.01);
(Continued)

(58) Field of Classification Search
CPC .......... G01K 15/002; G01K 7/02; G01K 7/16; G01K 2219/00; G01K 15/005;
(Continued)

(56) References Cited

U.S. PATENT DOCUMENTS 5,361,067 A * 11/1994 Pinckley ............. H03M 1/1052
                                                                    341/120
7,312,734 B2 * 12/2007 McNeill .............. H03M 1/1004
                                                                    341/120
(Continued)

OTHER PUBLICATIONS

Ekbert Hering et al; "Sensoren in Wissenschaft und Technik—Funktionsweise und Einsatzgebiete."; Viewag und Teubner, 2012, pp. 629-638; relevant sections cited in German Office Action dated Dec. 1, 2020, p. 5 of 6.
(Continued)

*Primary Examiner* — Jean B Jeanglaude
(74) *Attorney, Agent, or Firm* — Muncy, Geissler, Olds & Lowe, P.C.

(57) ABSTRACT

A device, which includes an input, configured to read in an analog signal, an analog/digital converter, configured to convert the analog signal into a digital value, and a processor, configured to determine a digital measured value. The processor is further configured to derive a calibrated digital value from the digital value with the aid of a linear calibration function and to derive the digital measured value from the calibrated digital value with the aid of a nonlinear measurement function. The processor modifies the linear calibration function in response to a calibration signal, based on an algorithm, which is based on the nonlinear measurement function, and a number of predefined comparison measured values.

12 Claims, 4 Drawing Sheets

(51) Int. Cl.
   *G01K 7/02* (2021.01)
   *G01K 7/16* (2006.01)
(52) U.S. Cl.
   CPC ....... *H03M 1/1009* (2013.01); *H03M 1/1033* (2013.01); *G01K 2219/00* (2013.01)
(58) Field of Classification Search
   CPC .... H03M 1/10; H03M 1/1009; H03M 1/1033; G01D 18/00
   See application file for complete search history.

(56) References Cited

U.S. PATENT DOCUMENTS

| | | | |
|---|---|---|---|
| 9,554,072 B2 * | 1/2017 | Medeiro Hidalgo . | H03M 1/002 |
| 9,584,146 B2 * | 2/2017 | Op 't Eynde ....... | H03M 1/1038 |
| 2006/0176197 A1 * | 8/2006 | McNeill .............. | H03M 1/1004 |
| | | | 341/120 |
| 2009/0110022 A1 | 4/2009 | Snyder et al. | |
| 2015/0215553 A1 * | 7/2015 | Medeiro Hidalgo . | H03M 1/145 |
| | | | 341/118 |
| 2016/0211861 A1 * | 7/2016 | Op 't Eynde ....... | H03M 1/1038 |
| 2019/0386673 A1 * | 12/2019 | Schrattenecker ... | H03M 1/1071 |

OTHER PUBLICATIONS

German Office Action in corresponding application 102020114244.7 dated Dec. 1, 2020—partial translation identifies relevant portion of cited document Ekbert Hering et al; "Sensoren in Wissenschaft und Technik—Funktionsweise und Einsatzgebiete".

* cited by examiner

DEVICES AND METHOD FOR CALIBRATING MEASURED VALUES

This nonprovisional application claims priority under 35 U.S.C. § 119(a) to German Patent Application No. 10 2020 114 244.7, which was filed in Germany on May 27, 2020 and which is herein incorporated by reference.

BACKGROUND OF THE INVENTION

Field of the Invention

The present invention relates to devices and a method which make a measured value calibration possible. In particular, the present invention relates to devices and methods which permit a measured value calibration in the field.

Description of the Background Art

Measuring transducers may be calibrated to a certain measured value range and/or certain measured values on the production side. For example, a linear calibration may be predefined on the production side, which assigns calibrated values to raw values. If the conditions prevailing in the field deviate from the assumptions made for the production-side calibration or from those in the environment used in the production-side calibration, it may be necessary or advantageous to adapt the calibration to the conditions prevailing in the field at the user end.

SUMMARY OF THE INVENTION

It is therefore an object of the present invention to provide in an exemplary embodiment, a first device that comprises an input, and is configured to read an analog signal, an analog/digital converter (ADC), configured to convert the analog signal into a digital value, and a processor, configured to determine a digital measured value, the processor being configured to derive a calibrated digital value from the digital value with the aid of a linear calibration function and to derive the digital measured value from the calibrated digital value with the aid of a nonlinear measurement function. The processor is further configured to modify the linear calibration function in response to a calibration signal, based on an algorithm, which is based on the nonlinear measurement function, and a number of predefined comparison measured values.

The term "device," can be understood to be, for example, an input/output module (I/O module). The term "I/O module," can be understood to be, for example, a module connectable or connected in series to a head station, which connects one or multiple field devices (for example, a sensor and/or an actuator) to the head station and possibly to a higher-level control unit (via the head station). The term "head station," can be understood to be, for example, a component of a modular field bus node, whose task is to make the data and/or the services of the I/O modules connected in series to the head station available via the field bus to which the head station is connected.

The term "input," can be understood to be, for example, an electrical connection, via which electrical signals (for example voltage and/or current values) may be read in (and thus further processed in the device). Moreover, the term "analog/digital converter," can be understood to be, for example, a circuit which determines in which of a large number of value ranges an analog value falls, and which outputs a digital value corresponding to the particular value range. The digital value may be output, for example, as a bitstring.

The term "processor," as used in the description and the claims, can be understood to be, for example, a circuit, which is configured to process commands from a command set assigned to the processor, the sequence of commands (and possibly the arguments assigned to the commands) being predefined by the algorithm executed by the processor. Moreover, the term "nonlinear measurement function," can be understood to be, for example, a nonlinear assignment rule (for example, a computation rule), with the aid of which measured values may be assigned to the digital values. The measured values may relate, for example, to a quantitative statement about a physical variable, e.g. the level of a temperature at a particular location. The measured value may be, for example, a numeric value, which is provided by the processor in digital form.

In addition, the term "calibration signal," can be understood to be, for example, a signal, which is triggered manually, for example by pressing a switch on a housing of the device, or which may be received via a data interface and starts a calibration routine.

The comparison measured values may comprise two analog signals, which correspond to known measured values.

For example, a temperature sensor may be connected to the input, and the temperature sensor may be exposed to two known temperatures (consecutively in time), so that the measured values to be generated are known (within the scope of the measurement accuracy), and the linear calibration function may be used to reduce or compensate for deviations.

The modification may comprise an iterative adaptation of the calibration function.

For example, parameters of the calibration function may be adapted in increasingly smaller steps until a sufficient correspondence has been achieved between the generated measured values and the generated physical values.

The iterative adaptation may be aborted when a predefined number of steps has been reached or a deviation between the particular known measured value and a measured value calculated using the adapted calibration function meets a certain criterion, or when a request to abort is received.

For example, an abort action may occur if a deviation is below the measurement accuracy threshold of the sensor.

The processor may be configured to modify the linear calibration function, in that a first value is determined in a first procedure, by which a numeric value assigned to the analog signal is multiplied, and a second value is determined in a second procedure, which is added to the product of the numeric value and the first value or subtracted from the product.

In this connection, it should be noted that the ordinal numbers "first," "second," etc., as used in the description and the claims, do not define a time sequence but are used only to differentiate features.

For example, the second value may be determined in the second procedure first, followed by the first value in the first procedure.

The processor may be further configured to determine the numeric value by multiplying the digital value by a third value and adding or subtracting a fourth value.

The linear calibration function may thus be implemented by two consecutive functions. For example, the first function may be permanently predefined on the production side and calibrate the signal path starting at the input (i.e. the measuring transducer), while a second function calibrates the signal path up to the input and is adaptable in the field.

For example, the sensor may be a resistance temperature sensor or a thermocouple, in which a calibration of the signal path up to the input may be necessary.

A second device according to the invention includes an input circuit for a sensor, in particular for a temperature sensor, for outputting an analog voltage, an ADC for inputting the analog voltage and for outputting a digital value, a first function module for an ADC-dependent first calibration of the digital value based on a first calibration for outputting a first calibration value, a second function module for an application-dependent second calibration of the first calibrated value based on a second calibration function for outputting a second calibrated value, a third function module for inputting the second calibrated value and for outputting a physical value of the sensor based on the second calibrated value, a fourth function module for comparing the physical value of the sensor with a predefinable setpoint value and outputting a comparison result, and a correction module for modifying the application-dependent second calibration function based on the comparison result.

The function modules may be implemented with the aid of dedicated hardware, software or a combination of dedicated hardware and software. For example, the function modules may be implemented with the aid of one or multiple signal processors.

A method according to the invention for configuring, in the field, measuring electronics, which are connected downstream from a sensor and which derive a calibrated value from a sensor signal with the aid of a linear calibration function and a measured value from the calibrated value with the aid of a nonlinear measurement function, comprises a modification of the linear calibration function based on a first sensor signal value and a second sensor signal value, which correspond to known measured values.

The modification may comprise an iterative adaptation of the calibration function, which may be aborted when either a predefined number of steps has been reached or a deviation between the particular known measured value and a measured value calculated using the adapted calibration function meets a certain criterion, or when a request to abort is received.

The modification may comprise a determination of a first value, by which a numeric value assigned to the second sensor signal value is multiplied, and may comprise a determination of a second value, which is added to the product of the numeric value and the first value or subtracted from the product.

The numeric value may be determined by multiplying a third value determined from the second sensor signal value by a fourth value and adding or subtracting a fifth value.

The first sensor signal value may be zero or correspond to a minimum absolute output value of the sensor.

For example, the sensor signal value may be selected in such a way that the numeric value or the absolute value of the numeric value is minimal.

It is furthermore understood that the features described in connection with the devices my also be features of the method and vice versa.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
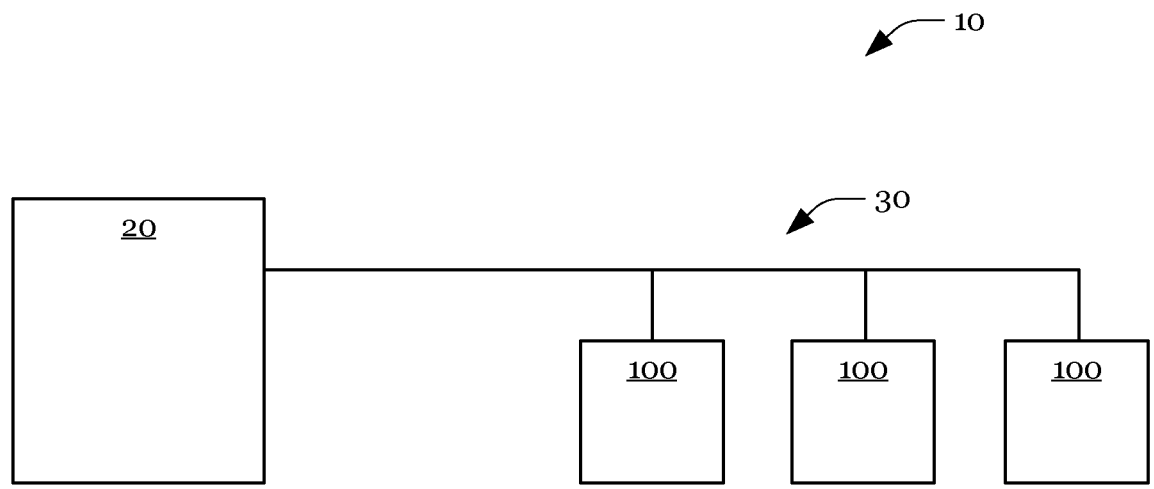
FIG. 1 shows a block diagram of a field bus system, which comprises a plurality of modular field bus nodes.

FIG. 1 shows a block diagram of a field bus system. Field bus system 10 comprises a higher-level control unit 20 and modular field bus nodes 100, which are connected to each other (via signals) via field bus 30. Higher-level control unit 20 may be used to monitor as well as regulate a system, which is controlled by field bus system 10. If higher-level control unit 20 monitors a system, higher-level control unit 20 may receive status data from field bus nodes 100 cyclically or acyclically, which describes the status of the system and generates an error signal or an alarm signal if the status of the system (substantially) deviates from a desired/permitted status or status range. If higher-level control unit 20 (not only monitors but also) regulates the system, higher-level control unit 20 may receive status data from field bus nodes 100 cyclically or acyclically and ascertain control data transmitted to field bus nodes 100, taking the status data into account.

Figure 2:
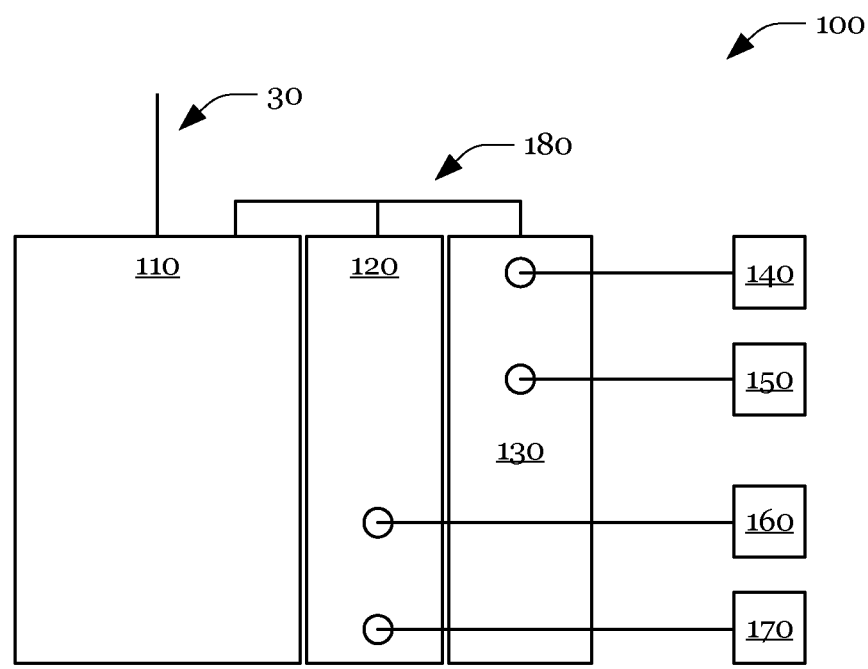
FIG. 2 shows a block diagram of a modular field bus node, which comprises a head station and a plurality of I/O modules and field bus devices connected to the I/O modules.

FIG. 2 shows a block diagram of a modular field bus node. Field bus node 100 comprises head station 110 and two I/O modules 120 and 130 connected in series to head station 110. Sensors and actuators 140, 150, 160 and 170 are connected via signals to I/O modules 120 and 130. During operation, I/O modules 120 and 130 read in sensor signals and generate status data from the sensor signals, which is transmitted to head station 110 via local bus 180. Head station 110 may process the status data locally and/or forward it (possibly in modified form) to higher-level control unit 20. Higher-level control unit 20 (or head station 110 in the case of local processing) may then generate control data, taking the status data into account.

The control data generated by higher-level control unit 20 may then be transmitted to (the same or another) head station via field bus 30. The control data transmitted to head station 110 (or generated by head station 110) is then forwarded/transmitted to I/O modules 120 and 130 (possibly in modified form). I/O modules 120 and 130 receive the control data and output control signals corresponding to the control data at the outputs to which the actuators are connected. The communication of data between the components of field bus system 10, the mapping of the sensor signals to status data and the mapping of control data to control signals may be adapted to different use scenarios by a configuration of field bus nodes 100.

Figure 3:
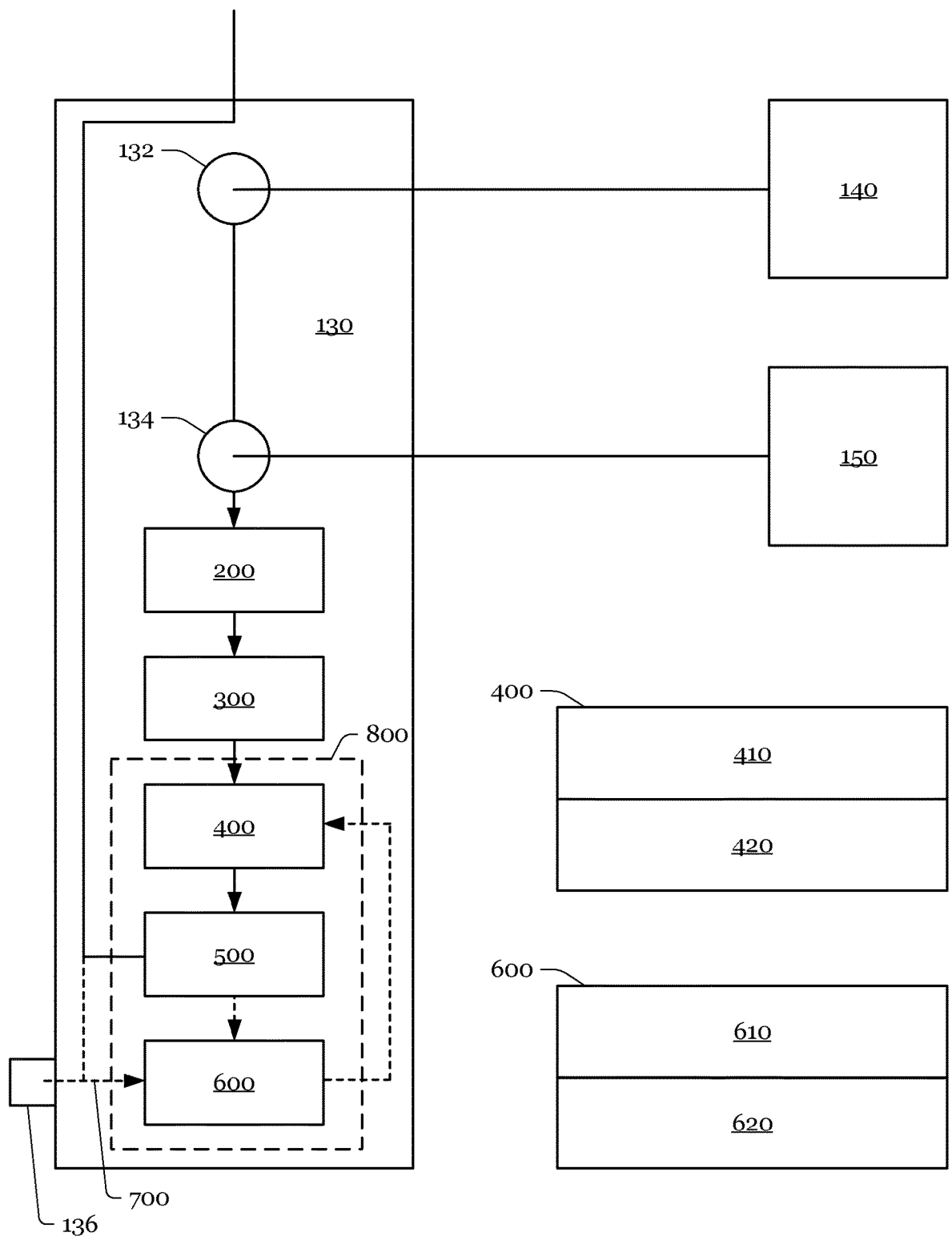
FIG. 3 shows a block diagram of an I/O module, which is provided with a measuring electronic system.

FIG. 3 shows a block diagram of a device according to the invention, which is designed as an I/O module. I/O module 130 comprises inputs 132 and 134. Sensor 150 is connected to I/O module 130 via input 134. Sensor 150 may be, for example, a temperature sensor, e.g. a resistance temperature sensor or a thermocouple. Input 134 is connected to input circuit 200. Input circuit 200 may be configured to apply a defined voltage to sensor 150 or to generate a defined current flow through sensor 150. Input circuit 200 may further be configured to detect a current flow through sensor 150 or to tap a voltage drop over sensor 150 or to generate an analog voltage proportional to a current flow or the voltage drop. I/O module 130 further comprises ADC 300. ADC 300 is configured to convert the analog voltage into a digital value.

The digital value is mapped to a calibrated value by calibration module 400. Since the mapped calibrated value is digital, it may also be referred to as calibrated digital value. Calibration module 400 applies a linear calibration function $k(x)$, i.e. a calibration function in the form $k(x)=a\cdot x+b$, x representing a numeric value corresponding to the digital value. In other words, the calibrated value may be derived from the digital value with the aid of the linear calibration function $k(x)$. Recall that the digital value represents an analog signal that has been converted. Thus, it may also be said that the calibrated value is derived from a sensor signal with the aid of the linear calibration function $k(x)$. Calibration module 400 may comprise function modules 410 and 420, function module 410 applying a first linear calibration function $k1=a1\cdot x+b1$ to the numeric value, and function module 420 applying a second linear calibration function $k2(k1(x))=a2\cdot k1(x)+b2$ to the output value of function module 410, i.e. the result of the first linear calibration function. It is thus seen that a2 represents a value by which the numeric value assigned to the analog signal is multiplied, and b2 represents a value that is added or subtracted from the product of the numeric value and a2.

First linear calibration function $k1(x)$ may be adapted, for example, to ADC 300, so that the result of the first linear calibration function would not require any further calibration (within the scope of the measurement accuracy) if the signal path up to input 134 were free of interference. Correspondingly second linear calibration function $k2(k1(x))$ may be provided to adapt the measuring electronics of I/O module 130 to the signal path up to input 134. Alternatively, only one linear calibration function $k(x)$ may also be provided instead of a chaining of two linear calibration functions.

The calibrated value is mapped to a measured value by function module 500. Since the mapped measured value is digital, it may also be referred to as digital measured value. The measured value may correspond to a physical variable, for example a temperature. The mapping takes place with the aid of a nonlinear measurement function, for example a second- or higher-order polynomial $m(y)=d+e\cdot y+f\cdot y^2+$, where $y=k2(k1(x))$. In other words, the measured value may be derived from the calibrated value with the aid of the nonlinear measurement function $m(y)$. If the signal path up to input 134 were to be free of interference, the nonlinear measurement function would result in correct measured values if a2=b2=0 is true, However, if there is interference in the signal path up to input 134, this interference may be reduced or compensated for by a corresponding selection of a2 and b2. I/O module 130 is therefore configured to modify the linear calibration function in response to a calibration signal 700, based on an algorithm, which is based on the nonlinear measurement function, and a number of predefined comparison measured values.

I/O module 130 may be provided with switches 136, and calibration signal 700 may be triggered by a startup engineer in that switch 136 is actuated. Alternatively or additionally, I/O module 130 may also be configured in such a way that calibration signal 700 may be triggered by a startup engineer if a corresponding message is received by I/O module 130 (via local bus 180). If comparison and correction module 600 receives calibration signal 700, comparison and correction module 600 iteratively modifies b2 and/or a2 until an abort criterion is met or the startup engineer aborts the procedure.

Comparison and correction module 600 may comprise function module 610 and correction module 620. Function module 610 may be configured to compare a measured value with a predefinable setpoint value and to output a comparison result. Correction module 620 may be configured to modify the (application-dependent) second linear calibration function $k2(k1(x))$ based on the comparison result.

Calibration module 400, function module 500 and comparison and correction module 600 may be implemented with the aid of dedicated hardware or by software executed on a processor 800.

Figure 4A:
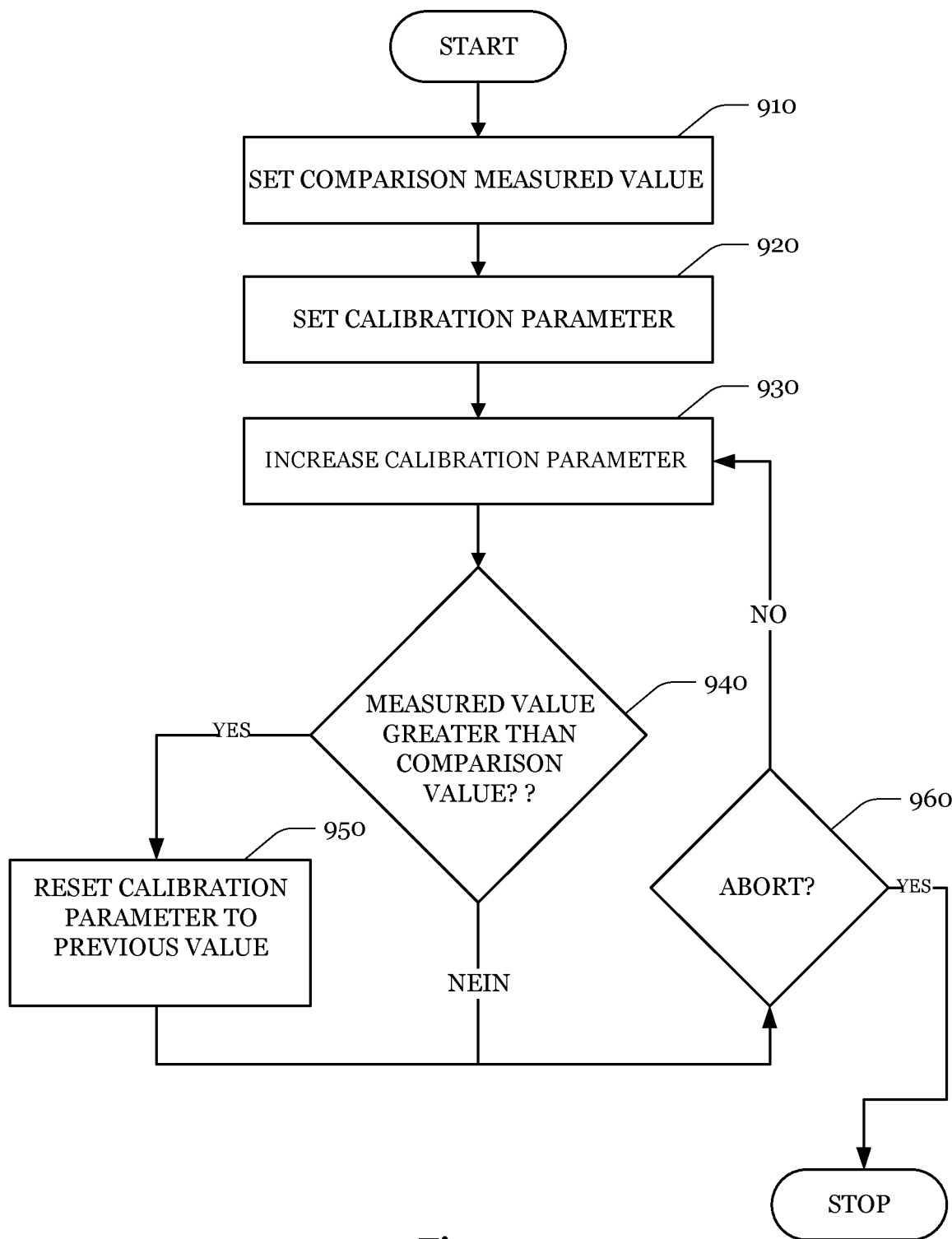
FIGS. 4a and 4b show a procedure for adapting the parameters of a linear calibration function.
Figure 4B:
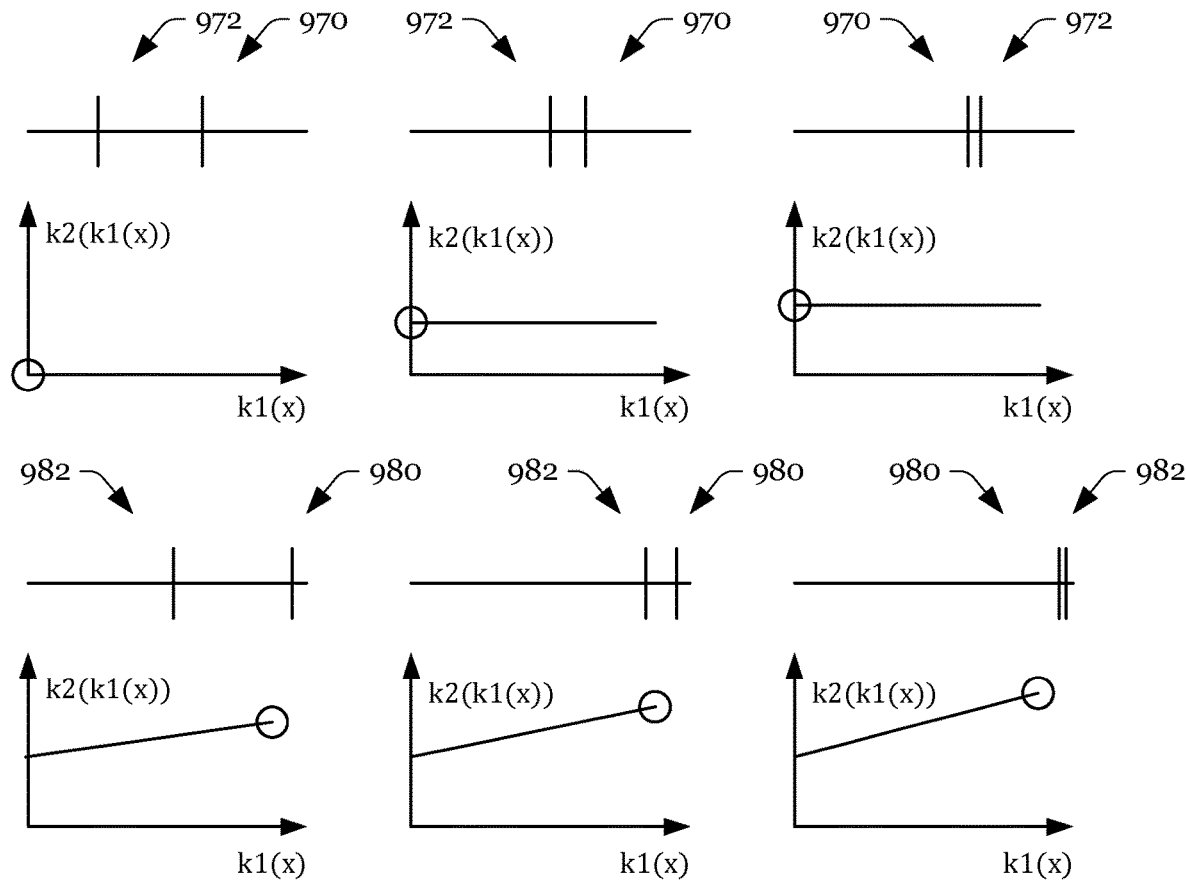

FIG. 4a shows a procedure which is passed through twice for the purpose of adapting a2 (representing a value by which the numeric value assigned to the analog signal is multiplied) and b2 (representing a value that is added or subtracted from the product of the numeric value and a2), the first pass being illustrated in the first row in FIG. 4b and the second pass being illustrated in the second row. In other words, FIGS. 4a and 4b show how the linear calibration function can be modified. In the first pass, a first comparison value 970 is set in step 910 and a start value for b2 (for example b2=0) is set in step 920. b2 is increased in step 930. The increase may be smaller in each step 930. For example, in each subsequent step 930, the increase may be half the size as in the preceding step 930. In addition, a wait time (for example, one second) may be provided between the loops.

If it is detected in decision block 940 that measured value 972 is greater than comparison value 970, the last increase is reversed in step 950. If a maximum number of loops has been reached, the procedure may be aborted in step 960. Moreover, the procedure may be aborted if an abort signal is received by the startup engineer. As indicated in FIG. 4b, comparison value 970 may be selected in such a way that the slope of second linear calibration function $k2(k1(x))$, i.e. a2, has a preferably minor influence on the calibration of the offset. For example, comparison value 970 may be selected in such a way that $k1(x)$ is approximately zero (first row in FIG. 4b, indicated by circles). This may be the case, for example, if the sensor signal value is zero or corresponds to a minimum absolute output value of the sensor.

In the second pass, a second comparison value 980 is set in step 910 and a start value for gain a2 (for example a2=0) is set in step 920. a2 is increased in step 930. The increase may be smaller in each step 930. For example, in each subsequent step 930, the increase may be half the size as in the preceding step 930. In addition, a wait time (for example, one second) may be provided between the loops.

If it is detected in decision block 940 that measured value 982 is greater than comparison value 980, the last increase is reversed in step 950. If a maximum number of loops has been reached, the procedure may be aborted in step 960. Moreover, the procedure may be aborted if an abort signal is received by the startup engineer. As indicated in FIG. 4b, comparison value 980 may be selected in such a way that the slope of second linear calibration function k2(k1(x)), i.e. a2, has a preferably great influence. For example, comparison value 980 may be selected in such a way that k1(x) is approximately maximal (second row in FIG. 4b, indicated by circles). This may be the case, for example, if the sensor signal value is maximal.

Figure 5:
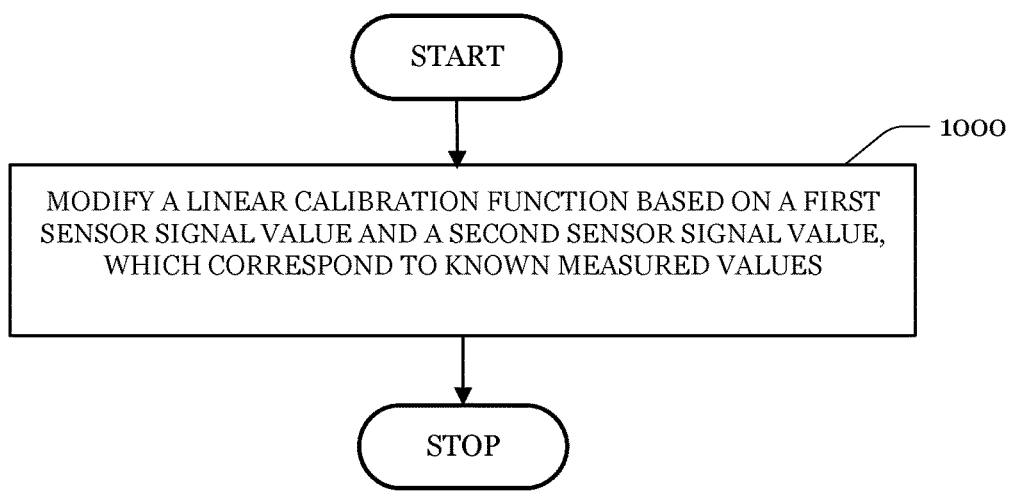
FIG. 5 shows the sequence of a method for configuring measuring electronics (connected downstream from a sensor) in the field.

FIG. 5 shows the sequence of a method for configuring measuring electronics connected downstream from sensor 150 in the field. The method comprises step 1010 of deriving the calibrated value from a sensor signal with the aid of a linear calibration function. Recall that the processor 800 (in particular the calibration module 400) may perform this step. The method also comprises step 1020 of deriving a measured value from the calibrated value with the aid of a nonlinear measurement function. Recall that the processor 800 (in particular the function module 500) may perform this step. The method further comprises step 1030 of modifying linear calibration function k2(k1(x)) based on two sensor signal values, which correspond to measured value 972 and 982. Recall that the processor 800 (in particular the comparison and correction module 600) may perform this step.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A device comprising:
an input configured to read an analog signal;
an analog/digital converter configured to convert the analog signal into a digital value; and
a processor configured to determine a digital measured value,
wherein the processor is configured to derive a calibrated digital value from the digital value with an aid of a linear calibration function,
wherein the processor is configured to derive the digital measured value from the calibrated digital value with an aid of a nonlinear measurement function, and
wherein the processor is configured to modify the linear calibration function in response to a calibration signal, based on an algorithm, which is based on the nonlinear measurement function and a number of predefined comparison measured values.

2. The device according to claim 1, wherein the comparison measured values comprise two analog signals, which correspond to two of the predefined comparison measured values.

3. The device according to claim 2, wherein the modification comprises an iterative adaptation of the linear calibration function.

4. The device according to claim 3, wherein the iterative adaptation is aborted if:
a predefined number of steps has been reached; or
a deviation between a particular predefined comparison measured value and the digital measured value calculated using the adapted linear calibration function meets a certain criterion; or
a request to abort is received.

5. The device according to claim 4, wherein the processor is configured to modify the linear calibration function in that a first value is determined in a first procedure, by which a numeric value assigned to the analog signal is multiplied, and a second value is determined in a second procedure, which is added to the product of the numeric value and the first value or subtracted from the product.

6. The device according to claim 5, wherein the processor is further configured to determine the numeric value by multiplying the digital value by a third value and adding or subtracting a fourth value.

7. A device comprising:
an input circuit for a sensor or a temperature sensor to output an analog voltage;
an analog/digital converter to input the analog voltage and to output a digital value;
a first function module for a first calibration of the digital value depending on the analog/digital converter based on a first calibration function for outputting a first calibration value;
a second function module for an application-dependent second calibration of the first calibrated value, based on a second calibration function for outputting a second calibrated value;
a third function module for inputting the second calibrated value and for outputting a physical value of the sensor based on the second calibrated value;
a fourth function module for comparing the physical value of the sensor with a predefinable setpoint value and outputting a comparison result; and
a correction module for modifying the application-specific second calibration function based on the comparison result.

8. A method for configuring measuring electronics connected downstream from a sensor, the method comprising:
deriving a calibrated value from a sensor signal with an aid of a linear calibration function;
deriving a measured value from the calibrated value with an aid of a nonlinear measurement function; and
modifying the linear calibration function based on a first sensor signal value and a second sensor signal value, which correspond to known measured values.

9. The method according to claim 8, wherein the modification comprises an iterative adaptation of the linear calibration function, which is aborted if:
either a predefined number of steps has been reached or a deviation between a particular known measured value and a measured value calculated using the adapted linear calibration function meets a certain criterion; or
a request to abort is received.

10. The method according to claim 8, wherein the modification comprises a determination of a first value via which a numeric value assigned to the second sensor signal value is multiplied, and comprises a determination of a second value, which is added to the product of the numeric value and the first value or subtracted from the product.

11. The method according to claim 10, wherein the numeric value is determined by multiplying a third value determined from the second sensor signal value by a fourth value and adding or subtracting a fifth value.

12. The method according to claim 11, wherein the first sensor signal value is zero or corresponds to a minimum absolute output value of the sensor.

* * * * *